(12) United States Patent
Shimoharai et al.

(10) Patent No.: US 9,850,342 B2
(45) Date of Patent: Dec. 26, 2017

(54) POLYESTER RESIN

(71) Applicant: TOYOBO CO., LTD., Osaka-shi, Osaka (JP)

(72) Inventors: Takuya Shimoharai, Otsu (JP); Koji Kobayashi, Otsu (JP)

(73) Assignee: Toyobo Co., Ltd., Osaka (JP)

( * ) Notice: Subject to any disclaimer, the term of this patent is extended or adjusted under 35 U.S.C. 154(b) by 0 days.

(21) Appl. No.: 15/104,852

(22) PCT Filed: Dec. 17, 2014

(86) PCT No.: PCT/JP2014/083396
§ 371 (c)(1),
(2) Date: Jun. 15, 2016

(87) PCT Pub. No.: WO2015/093524
PCT Pub. Date: Jun. 25, 2015

(65) Prior Publication Data
US 2016/0319066 A1    Nov. 3, 2016

(30) Foreign Application Priority Data

Dec. 19, 2013  (JP) ................................ 2013-262550

(51) Int. Cl.
| | | |
|---|---|---|
| C08G 63/52 | (2006.01) | |
| C08G 63/16 | (2006.01) | |
| C08J 5/18 | (2006.01) | |
| C08G 63/181 | (2006.01) | |
| H01L 31/049 | (2014.01) | |
| C08G 63/84 | (2006.01) | |
| C08G 63/87 | (2006.01) | |
| C08G 63/00 | (2006.01) | |

(52) U.S. Cl.
CPC ........... *C08G 63/16* (2013.01); *C08G 63/181* (2013.01); *C08G 63/84* (2013.01); *C08G 63/87* (2013.01); *C08J 5/18* (2013.01); *H01L 31/049* (2014.12); *C08J 2367/02* (2013.01); *Y02E 10/50* (2013.01)

(58) Field of Classification Search
USPC ....................................................... 528/306
See application file for complete search history.

(56) References Cited

U.S. PATENT DOCUMENTS

| | | |
|---|---|---|
| 2011/0130498 A1 | 6/2011 | Shinagawa et al. |
| 2013/0095263 A1 | 4/2013 | Carman, Jr. et al. |
| 2013/0095268 A1 | 4/2013 | Carman, Jr. et al. |
| 2013/0095269 A1 | 4/2013 | Carman, Jr. et al. |
| 2013/0095270 A1 | 4/2013 | Carman, Jr. et al. |
| 2013/0095271 A1 | 4/2013 | Carman, Jr. et al. |
| 2013/0095272 A1 | 4/2013 | Carman, Jr. et al. |
| 2013/0267674 A1 | 10/2013 | Kita et al. |

FOREIGN PATENT DOCUMENTS

| | | |
|---|---|---|
| CN | 101899145 A | 12/2010 |
| CN | 102050941 A | 5/2011 |
| CN | 103210039 A | 7/2013 |
| JP | H06-100680 A | 4/1994 |
| JP | H08-073719 A | 3/1996 |
| JP | H09-227767 A | 9/1997 |
| JP | 2008-291243 A | 12/2008 |
| JP | 2008-291244 A | 12/2008 |
| JP | 2010-212272 A | 9/2010 |
| JP | 2010-254827 A | 11/2010 |
| JP | 2010-280767 A | 12/2010 |
| JP | 2011-026470 A | 2/2011 |
| JP | 2011-132506 A | 7/2011 |
| JP | 2013-166874 A | 8/2013 |
| KR | 10-2013-0034808 A | 4/2013 |

OTHER PUBLICATIONS

Japanese Patent Office, International Search Report in Japanese Patent Application No. PCT/JP2014/083396 (dated Feb. 3, 2015).
Chinese Patent Office, The First Office Action in Chinese Patent Application No. 201480069403.X (dated Jan. 13, 2017).
Japanese Patent Office, Notification of Reasons for Revocation in Japanese Patent No. 5928655 (dated Mar. 7, 2017).
European Patent Office, Extended European Search Report in European Patent Application No. 14870679.9 (dated Jul. 17, 2017).
Japanese Patent Office, Notification of Sending Opponent Argument in Opposition No. 2016-701107 for Japanese Patent No. 5928655 (dated Jul. 5, 2017).
Japanese Patent Office, Notification of Reasons for Revocation in Japanese Patent No. 5928655 (dated Jul. 5, 2017).
Chinese Patent Office, The Second Office Action in Chinese Patent Application No. 201480069403.X (dated Sep. 25, 2017).

*Primary Examiner* — Terressa Boykin
(74) *Attorney, Agent, or Firm* — Leydig, Voit & Mayer, Ltd.

(57) ABSTRACT

The present invention provides a polyester resin which is excellent in long-term thermal stability and moldability, comprises a dicarboxylic acid component and a glycol component, wherein 10 mol % or more of a furandicarhoxylic acid is contained as the dicarboxylic acid component and the polyester resin satisfies following requirements (1) to (3);

(1) a total metal element content is 150 ppm or less relative to the mass of the polyester resin;
(2) a phosphorus element content is 100 ppm or less relative to the mass of the polyester resin; and
(3) TODΔ reduced viscosity represented by the following formula is 0.030 dl/g or less;

(TODΔ reduced viscosity)=(reduced viscosity before thermal oxidation test)−(reduced viscosity after thermal oxidation test).

16 Claims, No Drawings

POLYESTER RESIN

CROSS-REFERENCE TO RELATED APPLICATIONS

This patent application is the U.S. national phase of International Patent Application No. PCT/JP2014/083396, filed Dec. 17, 2014, which claims the benefit of Japanese Patent Application No. 2013-262550, filed on Dec. 19, 2013, which are incorporated by reference in their entireties herein.

TECHNICAL FIELD

The present invention relates to a polyester resin excellent in long-term heat resistance and moldability, a film, a sheet and an injection molded article using the same. In particular, the present invention relates to a polyester resin excellent in heat resistance and weather resistance suitable for outdoor applications such as an encapsulation sheet for a rear surface of a solar cell, and a film, a sheet, and an injection molded article using the same.

BACKGROUND ART

Generally, the performance of a polyester resin deteriorates gradually due to decomposition degradation of the polyester resin. In particular, since solar cell members, electric insulation members, and the like are placed under high temperature and high humidity for a long period of time, one major challenge is how to inhibit decomposition degradation for the polyester resin to be used and a film, a sheet, and an injection molded article using the resin.

The decomposition degradation of a polyester resin under high temperature and high humidity can be considered as being divided into thermal decomposition and hydrolysis.

First, decomposition of a polyester resin caused by heat is believed to proceed according to a reaction such as that described below. First, an ester linkage is cleaved by heat and, as a result, the polymer chain is cut and a carboxyl terminal group and a vinyl ester terminal are formed. Subsequently, a further reaction occurs at the vinyl ester terminal to eliminate acetaldehyde.

The hydrolysis due to water or water vapor is believed to proceed according to a reaction such as that described below. First, nucleophilic attack of a water molecule against an ester linkage causes cleavage of a polymer chain due to a hydrolysis reaction of the ester linkage to form a carboxyl group terminal and a hydroxy group terminal, and then the terminal hydroxy group formed causes back-biting and decomposition of the polymer chain is continued. In this reaction, a terminal carboxyl group plays a role to catalyze the hydrolysis reaction of a polymer and the hydrolysis is accelerated with increase of the amount of terminal carboxyl groups.

In order to inhibit such decomposition due to heat, water, or water vapor, many polyester resins small in the amount of terminal carboxyl groups have been proposed (see, for example, Patent Documents 1 and 2). The amount of terminal carboxyl groups has undoubtedly been reduced by such methods, but these are not sufficient for inhibiting decomposition for a long period of time. One of the reasons for this is that molding temperature increases due to a high melting point of a polyester resin. That is, even if the hydrolysis speed is reduced by blocking terminals of the polyester resin, new carboxyl groups are formed due to cleavage of a molecular chain caused by heat at the time of molding and, as a result, hydrolysis cannot be fully inhibited.

On the other hand, in order to solve such a decomposition degradation problem, there has been devised an invention to improve heat resistance by using a titanium compound and a phosphorus compound in combination (see, for example, Patent Document 3). When this method is used, a certain improvement in the heat resistance of a polymer is surely observed, but the level thereof is not necessarily high enough because a decomposition reaction is also promoted due to a high polymerization activity of the titanium compound. Moreover, there is a problem that the polymerization activity of titanium compound is lowered and, as a result, the degree of polymerization does not reach the goal or the polymerization time is remarkably prolonged and productivity worsens. Thus, excellent polymerization activity and sufficient heat resistance have not yet been achieved together.

PRIOR ART DOCUMENTS

Patent Documents

Patent Document 1: Japanese Unexamined Patent Application Publication No. 9-227767
Patent Document 2: Japanese Unexamined Patent Application Publication No. 8-73719
Patent Document 3: Japanese Unexamined Patent Application Publication No. 6-100680

SUMMARY OF INVENTION

Technical Problem

The present invention has been devised in consideration of such problems that lie in the conventional technologies. That is, the object of the present invention is to enable molding at low temperature and obtain excellent long-term heat resistance by inhibiting the formation of a carboxyl group due to thermal decomposition and reducing as possible the addition amount of a metal compound that serves as a catalyst while maintaining high polymerization activity.

Solution to Problems

The present inventors have studied earnestly in order to solve the above-described problems and, as a result, have accomplished the present invention by finding that a residual metal element of a polyester affects thermal degradation and hydrolysis and also finding an effect that excellent long-term heat resistance is exerted as outdoor applications such as encapsulation of the rear surface of a solar cell by adjusting the amount of the residual metal element to an extremely low concentration. That is, the features of the present invention are as follows.

[1] A polyester resin comprising a dicarboxylic acid component and a glycol component, wherein 10 mol % or more of a furandicarboxylic acid is contained as the dicarboxylic acid component and the polyester resin satisfies following requirements (1) to (3)

(1) a total metal element content is 150 ppm or less relative to the mass of the polyester resin;

(2) a phosphorus element content is 100 ppm or less relative to the Mass of the polyester resin;

(3) TOD Δ reduced viscosity represented by the following formula is 0.030 dl/g or less (TOD Δ reduced viscosity)=(Reduced viscosity before thermal oxidation test)−(Reduced viscosity after thermal oxidation test)

wherein the thermal oxidation test is a test in which a polyester resin sample having been subjected to a heat history comprising melting it at a temperature of the melting point of the polyester resin plus 30° C. in the air for 2 minutes and subsequently leaving it at the same temperature under a load of 100 kgf/cm$^2$ for 1 minute is heat treated in the air at a temperature of 180° C. for 60 minutes.

[2] The polyester resin according to [1], wherein catalysts used in polyester polymerization are an aluminum compound and a phosphorus compound.

[3] The polyester resin according to [1] or [2] wherein the polyester resin has a melting point of 220° C. or less.

[4] A film comprising the polyester resin according to any one of [1] to [3].

[5] A sheet comprising the polyester resin according to any one of [1] to [3].

[6] An injection molded article comprising the polyester resin according to any one of [1] to [3].

Advantageous Effects of Invention

The polyester resin of the present invention is excellent in long-term thermal stability. Thus, it is useful as a constituent member of a solar cell or the like, which is used outdoors.

DESCRIPTION OF EMBODIMENTS

The polyester resin of the present invention contains a catalyst (metal element) in a polyester and is a kind of composition, but it is expressed as a "resin" because the catalyst exists in a very small amount. The polyester resin of the present invention is characterized in that the total metal element content is 150 ppm or less relative to the mass of the polyester resin. If a large amount of metal is contained in the polyester, it may promote a thermal decomposition reaction of the polyester under high temperature and this may serve as a factor to cause thermal degradation of the polyester. Accordingly, the content of metal elements is limited to 150 ppm or less in terms of maintaining the long-term thermal stability of the polyester resin in the present invention. Moreover, the content of metal elements is preferably 100 ppm or less, more preferably 80 ppm or less, even more preferably 50 ppm or less. Although a smaller content of metal elements is preferred in terms of reducing thermal degradation of the polyester resin, it is desirable to add a transition metal or typical metal element as a catalyst within the above-mentioned concentration range in order to promote polymerization reaction at the time of during the polyester production. For this reason, the lower limit of the content of metal elements is preferably 1 ppm or more, more preferably 5 ppm or more, even more preferably 10 ppm or more. From the viewpoint of the productivity of the polyester, it is desirable to choose an appropriate catalytic species as described below in order to exert a sufficiently high catalytic activity even within the above-mentioned range of the content.

The polyester resin of the present invention is one which comprises mainly of a dicarboxylic acid component and a glycol component and in which a tri-functional or more component has optionally been copolymerized.

A furandicarboxylic acid component has been copolymerized in the polyester resin of the present invention. The furandicarboxylic acid component has an effect of more reducing the melting point of a resin by being copolymerized as compared with terephthalic acid, which is often used as a raw material to a polyester resin, though the furandicarboxylic acid component has an aromatic ring structure. When molding a resin, it is necessary to set the molding temperature to be not lower than the melting point of the resin. However, since the furandicarboxylic acid having been copolymerized in the polyester resin makes it possible to set the molding temperature to be lower, the formation of carboxyl groups due to thermal decomposition is inhibited and good long-term thermal stability is acquired. Among the isomers of the furandicarboxylic acid, 2,5-furandicarboxylic acid particularly preferred in view of reactivity, stereostructure of a polymer chain, and so on.

The furandicarboxylic acid to be used for the polyester resin of the present invention is required to be copolymerized in a copolymerization ratio relative to all dicarboxylic acid components of 10 mol % or more and the copolymerization ratio is preferably 15 mol % or more, more preferably 20 mol % or more, particularly preferably 50 mol % or more, and may be 100 mol %. A copolymerization ratio of less than 10 mol % is undesirable because it has almost no effect of reducing a melting point.

Dicarboxylic acid components to be used for the polyester resin of the present invention other than furandicarboxylic acid are not particularly limited and examples thereof include aromatic dicarboxylic acids such as terephthalic acid, isophthalic acid, phthalic acid, naphthalene dicarboxylic acid, 4,4'-dicarboxybiphenyl, and 5-sodium sulfoisophthalic acid; alicyclic dicarboxylic acids, such as 1,4-cyclohexanedicarboxylic acid, 1,3-cyclohexanedicarboxylic acid, 1,2-cyclohexanedicarboxylic acid, 2,5-norbornenedicarboxylic acid, and tetrahydrophthalic acid; and aliphatic dicarboxylic acids, such as oxalic acid, malonic acid, succinic acid, adipic acid, azelaic acid, sebacic acid, undecanedioic acid, dodecanedioic acid, octadecanedioic acid, fumaric acid, maleic acid, itaconic acid, mesaconic acid, citraconic acid, and dimer acid. Of these, use of an aliphatic dicarboxylic acid component results in further drop of a melting point and may cause remarkable deterioration of heat resistance, and therefore use of an aromatic dicarboxylic acid is preferred. In particular, terephthalic acid and 2,6-naphthalene dicarboxylic acid are more preferred from the viewpoints of general versatility and heat resistance. Among these, one or two or more species may be copolymerized.

The glycol component to be used for the polyester resin of the present invention is not particularly limited and examples thereof include aliphatic glycols, such as ethylene glycol, 1,2-propanediol, 1,3-propanediol, 1,2-butanediol, 1,3-butanediol, 1,4-butanediol, 2-methyl-1,3-propanediol, 2-amino-2-ethyl-1,3-propanediol, 2-amino-2-methyl-1,3-propanediol, 1,10-decanediol, dimethyloltricyclodecane, diethylene glycol, and triethylene glycol; ethylene oxide adducts or propylene oxide adducts of bisphenol A, bisphenol S, bisphenol C, bisphenol Z, bisphenol AP, and 4,4'-biphenol; alicyclic glycols, such as 1,2-cyclohexanedimethanol, 1,3-cyclohexanedimethanol, and 1,4-cyclohexanedimethanol; polyethylene glycol, and polypropylene glycol. In particular, ethylene glycol is preferred from the viewpoints of applicability for general purpose and heat resistance.

A tri-functional or more carboxylic acid or a tri-functional or more alcohol component may optionally be copolymerized in the polyester resin of the present invention in order to enhance functionalities such as mechanical strength. The copolymerization ratio of a tri-functional or more monomer is appropriately about 0.2 to about 5 mol % relative to 100 mol % of all dicarboxylic acid components or 100 mol % of all glycol components. If the copolymerization ratio of the tri-functional or more monomer is excessively low, no effects derived from copolymerization develop, and if the copolymerization ratio is excessively high, gelation may be considered as a problem. Examples of the tri-functional or more carboxylic acid include aromatic acids such as trimellitic acid, pyromellitic acid, benzophenone tetracarboxylic acid, trimellitic anhydride, pyromellitic anhydride benzophenone tetracarboxylic anhydride, and trimesic acid; and aliphatic carboxylic acids such as 1,2,3,4-butanetetracarboxylic acid. Examples of the tri-functional or more alcohol component include glycerol, trimethylolpropane, trimethylolethane, pentaerythritol, α-methylglucose, mannitol, and sorbitol.

Moreover, hydroxycarboxylic acids, lactones, monocarboxylic acids, and monoalcohols may be used as a copolymerization component for the polyester resin of the present invention. The copolymerization ratio of these copolymerization components is appropriately about 5 mol % or less relative to 100 mol % of all dicarboxylic acid components or 100 mol % of all glycol components. Examples of the hydroxycarboxylic acids include p-hydroxybenzoic acid, m-hydroxybenzoic acid, o-hydroxybenzoic acid, lactic acid, glycolic acid, 2-hydroxybutyric acid, 3-hydroxybutyric acid, 4-hydroxybutyric acid, 2-hydroxyisobutyric acid, 2-hydroxy-2-methylbutyric acid, 2-hydroxyvaleric acid, 3-hydroxyvaleric acid, 4-hydroxyvaleric acid, 5-hydroxyvaleric acid, 6-hydroxycaproic acid, and 10-hydroxystearic acid. Examples of the lactones include β-propiolactone, β-butyrolactone, γ-butyrolactone, δ-valerolactone, and ε-caprolactone. Examples of the monocarboxylic acids include lauric acid, myristic acid, palmitic acid, stearic acid, oleic acid, linoleic acid, linolenic acid, benzoic acid, p-tert-butylbenzoic acid, cyclohexane acid, and 4-hydroxyphenylstearic acid, and examples of the monoalcohols include octyl alcohol, decyl alcohol, lauryl alcohol, myristyl alcohol, cetyl alcohol, stearyl alcohol, and 2-phenoxyethanol.

Polymerization methods for the polyester resin include a transesterification method using a carboxylic acid diester component and a glycol component as starting materials and a direct esterification method using a dicarboxylic acid component and a glycol component as starting materials. In the transesterification method, the content of metal element may not satisfy the aforementioned concentration range because a catalyst such as Zn, Ca and Mg is added at the time of transesterification in order to secure productivity. Accordingly, the polymerization method for a polyester in the present invention is preferably a direct esterification method.

Properties of an oligomer before polycondensation are important in order to secure reactivity in a small metal amount by using a furandicarboxylic acid. Specifically, it is preferred that esterification is carried out without using a catalyst and a catalyst is added after the esterification, followed by homogenization by stirring, and then the polycondensation step is started during a stage where the oligomer acid value is not less than 100 eq/ton. When the oligomer acid value is 100 eq/ton or more, it is possible to secure, in addition to catalytic activity of metal, productivity because protons of oligomers serve as a polycondensation catalyst. The oligomer acid value is preferably 200 eq/ton or more, more preferably 300 eq/ton or more. In terms of catalytic ability of proton, a higher oligomer acid value is preferred, but if the oligomer acid value exceeds 600 eq/ton, polymerization does not proceed due to defective esterification and the molecular weight may not increase.

The polymerization catalyst to be used in polymerizing the polyester resin of the present invention is preferably not a heavy metal in terms of environmental load, and it is more preferably an aluminum compound in terms of polymerization activity and physical properties of the polyester.

Publicly known aluminum compounds can be used as the aforementioned aluminum compound.

Examples of the aluminum compound specifically include carboxylic acid salts such as aluminum formate, aluminum acetate, aluminum subacetate, aluminum propionate, and aluminum oxalate; inorganic acid salts such as aluminum chloride, aluminum hydroxide, and aluminum hydroxychloride, aluminum alkoxides, such as an aluminum methoxide, aluminum ethoxide, aluminum isopropoxide, aluminum n-butoxide, and aluminum tert-butoxide, aluminum chelate compounds, such as aluminum acetylacetonate and aluminum acetylacetate, organoaluminum compounds, such as trimethylaluminum and triethylaluminum, and partial hydrolysates thereof, and aluminum oxide. Of these, carboxylic acid salts, inorganic acid salts, and chelate compounds are preferred, and of these, aluminum acetate, aluminum subacetate, aluminum chloride, aluminum hydroxide, aluminum hydroxychloride, and aluminum acetylacetonate are particularly preferred.

The aluminum compound alone has low polymerization activity and is required to be added in an amount of 150 ppm or more relative to all constituent units of the carboxylic acid component such as dicarboxylic acids and polyfunctional carboxylic acids of the polyester in order to secure productivity. To adjust the total metal element content to 150 ppm or less relative to the polyester, it is preferred to add a phosphorus compound as a catalytic promoter for the purpose of increasing polymerization activity.

In the present invention, the concentration of the phosphorus compound to be used as the above-mentioned catalytic promoter is preferably 100 ppm or less in terms of phosphorus element content relative to the mass of the polyester resin. If the phosphorus element content relative to the polyester exceeds the above-mentioned range, the phosphorus compound is incorporated in the main chain of the polyester during the polymerization reaction of the polyester and the durability of the polyester deteriorates in some cases. The phosphorus element content relative to the polyester is preferably 95 ppm or less, more preferably 90 ppm or less. When using as the catalytic promoter, the phosphorus element content is preferably 1 ppm or more, more preferably 3 ppm or more for the purpose of increasing polymerization activity. The type and the addition amount of the preferred phosphorus compound to be used in the present invention will be described below, and the addition amount of the phosphorus compound is then indicated by the addition amount relative to all constituting units of the carboxylic acid component.

The phosphorus compound to be used as the catalytic promoter is not particularly limited, use of one compound or two or more compounds selected from the group consisting of phosphonic acid-based compounds and phosphinic acid-based compounds is preferred because of its great effect of improving catalytic activity. Of those, use of one or two or more phosphonic acid-based compounds is preferred because of its particularly great effect of improving catalytic activity. Especially, a phosphorus compound having a phenol moiety in the same molecule is particularly preferred from the viewpoint of improving the thermal oxidation stability of a polyester.

Examples of the phosphorus compound containing a phenol moiety to be used as the catalytic promoter for the polyester resin of the present invention specifically include ethyl 3,5-di-tert-butyl-4-hydroxybenzylphosphonate, methyl 3,5-di-tert-butyl-4-hydroxybenzylphosphonate, isopropyl 3,5-di-tert-butyl-4-hydroxybenzylphosphonate, phenyl 3,5-di-tert-butyl-4-hydroxybenzylphosphonate, octadecyl 3,5-di-tert-butyl-4-hydroxybenzylphosphonate, 3,5-di-tert-butyl-4-hydroxybenzylphosphonic acid, lithium [ethyl 3,5-di-tert-butyl-4-hydroxybenzylphosphonate], sodium [ethyl 3,5-di-tert-butyl-4-hydroxybenzylphosphonate], sodium [3,5-di-tert-butyl-4-hydroxybenzylphosphonic acid], calcium bis[ethyl 3,5-di-tert-butyl-4-hydroxybenzylphosphonate], calcium bis[3,5-di-tert-butyl-4-hydroxybenzylphosphonic acid], diethyl 3,5-di-tert-butyl-4-hydroxybenzylphosphonate, and diphenyl 3,5-di-tert-butyl-4-hydroxybenzylphosphonate. Of these, diethyl 3,5-di-tert-butyl-4-hydroxybenzylphosphonate, which is commercially available under the name of Irganox 1222 (produced by BASF), and calcium bis[ethyl 3,5-di-tert-butyl-4-hydroxybenzylphosphonate], which is commercially available under the name of Irganox 1425 (produced BASF), are particularly preferred.

The polyester of the present invention can also be prepared using titanium as a catalyst. Also when titanium is used as a catalyst, productivity can be secured at a small addition amount, but since titanium is high in catalytic activity, thermal oxidative degradation of a polyester tends to occur under heating and long-term thermal stability may not be acquired. For this reason, it is preferred in the present invention to use a catalytic species other than titanium as a catalytic species for a polyester.

Since the polyester resin of the present invention can favorably be obtained using the above-mentioned catalytic species, the total metal element content relative to the polyester resin can be limited to 150 ppm or less. For this reason, the polyester resin of the present invention is excellent in thermal oxidation stability and can exert thermal stability over a long term. The TODΔ reduced viscosity expressed by the following formula, which is an index of thermal oxidation stability, of the polyester resin of the present invention is 0.030 dl/g or less.

(TODΔ reduced viscosity)=(reduced viscosity before thermal oxidation test)−(reduced viscosity after thermal oxidation test)

where the thermal oxidation test is a test in which a polyester resin sample having been subjected to a heat history comprising melting it at a temperature of the melting point of the polyester resin plus 30° C. in the air for 2 minutes and subsequently leaving it at the same temperature under a load of 100 kgf/cm$^2$ for 1 minute is heat treated in the air at a temperature of 180° C. for 60 minutes.

The thermal oxidation test is described in detail here. The thermal oxidation test is a test in which a polyester resin sample having been subjected to a heat history comprising melting it at a temperature of the melting point of the polyester resin plus 30° C. in the air for 2 minutes and subsequently leaving it at the same temperature under a load of 100 kgf/cm$^2$ for 1 minute is frozen and pulverized to form a powder with a size of 100 meshes or less, and then is vacuum dried at 70° C. and 1 Torr or less for 12 hours, and then 0.3 g of the resultant is weighed out, put into a glass test tube, and then heat treated in the air at a temperature of 180° C. for 60 minutes.

In the thermal oxidation test, it is necessary to prepare a heated and pressed sheet at a temperature of the melting point of the polyester resin plus 30° C. for the purpose of providing a heat history before freezing and pulverizing the polyester resin sample. Specifically, 1.0 g of polyester resin is placed between two sheets of Teflon (registered trademark), further placed between two stainless steel plates, then mounted to a heat pressing machine, melted at a temperature of the melting point, of the polyester resin plus 30° C. for 2 minutes, being applied a load of 100 kgf/cm$^2$ and 1 minute later, rapidly cooled in water, thereby preparing a sample. It is necessary to use the sheet sample having resulted from this heat history for freezing and pulverizing.

This is reproduction as a model of the formation of carboxyl groups by thermal decomposition during molding; the polyester resin of the present invention, which contains a furandicarboxylic acid component and is low in total metal element content, can be inhibited from lowering of its viscosity during the thermal oxidation test because the formation of carboxyl groups is inhibited efficiently.

Since the thermal oxidative decomposition is accompanied by the formation of carboxyl groups, the decomposition speed is not constant and the decomposition proceeds at an accelerated rate as the TODΔ reduced viscosity increases. Although outdoor use is allowed when the TODΔ reduced viscosity is 0.030 dl/g or less, the reduced viscosity is preferably 0.025 dl/g or less, even more preferably 0.020 dl/g or less, and its lower limit is 0. TODΔ reduced viscosity of 0.020 dl/g or less is desirable because the progress of the decomposition is inhibited.

A smaller total metal content is more advantageous for thermal oxidation stability. However, a small metal content, in other words, a small amount of the catalyst results in disadvantage in productivity. Accordingly, it is preferred to secure polymerization activity by using the phosphorus compound, which is a catalytic promoter, with a small amount of aluminum compound in combination. Moreover, the phosphorus compound preferably has a phenol moiety. This is because the phosphorus compound having a phenol moiety has an effect of inhibiting degradation of the polyester, which is decomposed by a radical mechanism under oxygen. In order to enhance this function, it is preferred that the phenol moiety is sterically and electronically stabilized and has a hindered phenol skeleton, which exerts radical trapping ability more.

The reduced viscosity of the polyester resin of the present invention is desirably 0.1 to 2.0 dl/g though it is not particularly limited. If the reduced viscosity is less than 0.1 dl/g, the polyester resin has a significantly reduced mechanical strength and becomes difficult to be used practically. If the reduced viscosity is more than 2.0 dl/g, the handling property deteriorates because the melt viscosity becomes high and the productivity may be affected adversely because the polymerization time is prolonged. The reduced viscosity is preferably 0.2 to 1.8 dl/g, more preferably 0.3 to 1.5 dl/g.

A terminal blocking agent, such as carbodiimide compounds, oxazoline compounds and epoxy compounds, may be incorporated into the polyester resin of the present invention in an arbitrary ratio in order to block carboxyl groups to be formed when decomposition degradation has occurred at high temperature and high humidity.

In order to enhance the performance of the polyester resin of the present invention, generally well-known stabilizers, lubricants, releasing agents, plasticizers, flame retardants, flame retardant auxiliary agents, UV absorbers, light stabilizers, pigments, dyes, antistatic agents, conductivity imparting agents, dispersing agents, compatibilizers, antibacterial agents, fillers, etc. may be added alone or in combination of two or more thereof.

The polyester resin of the present invention can be molded into a film, a sheet, an injection molded article, etc. using a molding method known in the art.

EXAMPLES

The present invention is described concretely below with reference to Examples, but the present invention is not limited thereto. The measured values disclosed in the Examples are values measured by the following methods.

(1) Reduced Viscosity (η sp/c)

A sample weighing 0.1 g was dissolved in 25 ml of a mixed solvent of parachlorophenol/tetrachloroethane=6/4 (mass ratio), and the reduced viscosity thereof was measured at 30° C. by using an Ubbelohde viscosity tube.

(2) TODΔ Reduced Viscosity

First, 1.0 g of a polyester resin was placed between two Teflon registered trademark) sheets and was mounted to a heat press machine while further being placed between two stainless steel plates in the air, after melting at a temperature of the melting point of the polyester resin plus 30° C. for 2 minutes, a load of 100 kgf/cm² was applied and, one minute later, the processed polyester resin was immersed in water to cool rapidly, thereby preparing a sheet sample.

The polyester resin sample thus subjected to a heat history was frozen and pulverized to form a powder with a size of 100 meshes or less, and then was vacuum dried at 70° C. and 1 Torr or less for 12 hours. A 0.3 g portion of the powder was weighed out, placed in a glass test tube, and heat treated in the air, at 180° C. for 60 minutes, and then the reduced viscosity thereof was measured in the same manner as described above and a TODΔ reduced viscosity was calculated from the following formula.

(TODΔ reduced viscosity)=(reduced viscosity before thermal oxidation test)−(reduced viscosity after thermal oxidation test)

(3) Melting Point

A polyester resin (5.0 mg) was placed in an aluminum pan for DSC, heated up to 300° C. to melt, and then cooled rapidly in liquid nitrogen. The polyester resin pre-treated in this manner was analyzed with a differential scanning calorimetric analyzer "X-DSC 7000" manufactured by Hitachi High-Tech Science Corporation. An endothermic peak found in a thermogram curve produced by elevating the temperature from 20° C. to 300° C. at a rate of 20° C./minute was taken as a melting point.

(4) Polyester Resin Composition

The determination of the composition and composition ratio of a polyester resin was carried out by $^1$H-NMR measurement (proton type nuclear magnetic resonance spectroscopic measurement) at a resonance frequency of 400 MHz. An NMR apparatus 400-MR manufactured by VARIAN was used as a measurement instrument and a mixture of deuterated chloroform/trifluoroacetic acid=85/15 (mass ratio) was used as a solvent.

(5) Content (ppm) of All Metal Elements in Polyester Resin Sample

The content of phosphorus was determined by fluorescent X-ray analysis. The contents of other metals were determined by inductively coupled plasma atomic emission spectroscopy and atomic absorption spectrophotometry following ashing/acid dissolution of a polymer. In any event, the amounts of elements in the sample were determined from a previously produced calibration curve.

(Preparation of Polycondensation Catalyst Solution)

(Preparation of Ethylene Glycol Solution of Irganox1222)

Ethylene glycol (2.0 liters) was added at normal temperature and normal pressure to a flask equipped with a nitrogen inlet tube and a condenser, and then 200 g of Irganox 1222 (produced by BASF) as a phosphorus compound was added while stirring at 200 rpm under a nitrogen atmosphere. After adding additional 2.0 liters of ethylene glycol, the jacket temperature setting was changed to 196° C. and the temperature was elevated and then stirring was performed under reflux for 60 minutes since the point, at which the inner temperature reached 185° C. or more. Then, heating was stopped and the solution was immediately removed from the heat source and cooled to a temperature of 120° C. or lower within 30 minutes while maintaining the nitrogen atmosphere.

(Preparation of Aqueous Solution of Aluminum Compound)

Pure water (5.0 liters) was added at normal temperature and normal pressure to a flask equipped with a condenser and then 200 g of aluminum subacetate was added in the form of slurry with pure water while stirring at 200 rpm. Moreover, pure water was added such that the overall volume would become 10.0 liters and the stirring was performed at normal temperature and normal pressure for 12 hours. Then, the jacket temperature set was changed to 100.5° C. and the temperature was elevated and then stirring was performed under reflux for 3 hours since the point at which the inner temperature reached 95° C. or more. Then, the stirring was stopped and the mixture was allowed to cool to room temperature, thereby obtaining an aqueous solution.

(Preparation of Ethylene Glycol Mixed Solution of Aluminum Compound)

To the aqueous aluminum compound solution prepared by the above-described method, an equal volume of ethylene glycol was added, followed by stirring at room temperature for 30 minutes, and then the pressure was reduced slowly while controlling the inner temperature at 80 to 90° C., and then water was distilled off from the system to reach 27 hPa while stirring for several hours. Thus, a 20 g/l ethylene glycol solution of the aluminum compound was obtained.

(Preparation of Ethylene Glycol Solution of Antimony Compound)

Antimony trioxide was dissolved in ethylene glycol, thereby obtaining a 14 g/l ethylene glycol solution of antimony trioxide.

(Preparation of Aqueous Solution of Germanium Compound)

Germanium dioxide was dissolved in water, obtaining an 8 g/L aqueous solution of germanium dioxide.

(Preparation of Ethylene Glycol Solution of TMPA)

Trimethylphosphoric acid (TMPA) was dissolved in ethylene glycol, thereby obtaining a 20 g/l ethylene glycol solution of TMPA.

(Preparation of 1-Butanol Solution of TBT)

Tetra-n-butoxytitanium (TBT) was dissolved in 1-butano thereby obtaining a 68 g/l 1-butanol solution of TBT.

(Preparation of Ethylene Glycol Solution of Cobalt Acetate)

Cobalt acetate was dissolved in ethylene glycol, thereby obtaining a 20 g/g ethylene glycol solution of cobalt acetate.

Example 1

A stainless steel autoclave with a capacity of 2 liters equipped with a stirrer was charged with 428.5 g (2.7 mol) of 2,5-furandicarboxylic acid and 219.5 g (3.5 mol) of ethylene glycol, and then an esterification reaction was carried out under a pressure of 0.25 MPa for 150 minutes while elevating the temperature up to 220° C., thereby obtaining an oligomer mixture. Then, the prepared ethylene glycol solution of Irganox 1222 and the prepared ethylene glycol mixed solution of an aluminum compound were added such that the prescribed residual amounts would be attained, and then the pressure of the reaction system was lowered slowly to 13.3 Pa (0.1 Torr) while elevating the temperature up to 250° C. over 60 minutes, and moreover a polyester polycondensation reaction was carried out at 250° C. and 13.3 Pa for 60 minutes. Following release of pressure, a resin was discharged in a strand form into cold water under slight pressure, thereby being cooled rapidly, and then held in the cold water for 20 seconds, followed by cutting. Thus, cylinder-shaped pellets of about 3 mm in length and about 2 mm in diameter were obtained. The properties of the polyester pellets are shown in a table.

Examples 2 to 4

Polyester resin examples 2 to 4 were produced according to the polymerization method of Example 1 except having changed the type and blend ratio of the raw materials. The composition, residual metal amounts, and physical properties of the resins obtained are shown in the table. These satisfy the ranges stipulated in the present invention and exhibited good thermal oxidation stability.

Comparative Examples 1 to 6

Polyester resin examples 1 to 6 were produced according to the polymerization method of Example 1 except having changed the type and incorporation ratio of the raw materials. The composition, residual metal amounts, and physical properties of the resins obtained are shown in the table. Since Comparative Example 1 is excessively large in incorporation amount of a phosphorus compound and Comparative Examples 2 to 5 are excessively large in residual metal amount, each of them is poor in thermal oxidation stability and the TODΔ reduced viscosity is greater than 0.030 dl/g, and therefore it is revealed that the resins are unsuitable for outdoor applications. Comparative Example 6 is small in residual metal amount, but a large number of carboxyl groups were formed because the temperature of the heat treatment performed before a thermal oxidation test was high due to a high melting point, and thus the TODΔ reduced viscosity was greater than 0.030 dl/g.

TABLE 1

| | | Examples | | | | Comparative Examples | | | | | |
|---|---|---|---|---|---|---|---|---|---|---|---|
| | | 1 | 2 | 3 | 4 | 1 | 2 | 3 | 4 | 5 | 6 |
| Residual metal amount (ppm) | Al | 20 | 20 | | | | | | 300 | | 20 |
| | Ti | | | 120 | 120 | 120 | | | | 210 | |
| | Sb | | | | | | 365 | | | | |
| | Ge | | | | | | | 230 | | | |
| | Co | | | | | | | 60 | | | |
| P-compound | Kind | Irg. 1222 | Irg. 1222 | TMPA | TMPA | TMPA | — | TMPA | Irg. 1222 | — | Irg. 1222 |
| | Residual amount (ppm) | 58 | 58 | 5 | 60 | 150 | — | 30 | 58 | — | 58 |
| Composition | FDCA | 100 | 15 | 100 | 100 | 100 | 15 | 15 | 15 | 15 | |
| | TPA | | 85 | | | | 85 | 85 | 85 | 85 | 100 |
| | EG | 100 | 100 | 100 | 100 | 100 | 100 | 100 | 100 | 100 | 100 |
| Reduced viscosity (dl/g) | | 0.495 | 0.503 | 0.498 | 0.512 | 0.504 | 0.517 | 0.490 | 0.501 | 0.511 | 0.505 |
| Melting point (° C.) | | 211 | 250 | 212 | 212 | 210 | 251 | 249 | 250 | 251 | 260 |
| TOD Δ Reduced viscosity | | 0.004 | 0.017 | 0.026 | 0.022 | 0.039 | 0.089 | 0.042 | 0.045 | 0.095 | 0.033 |

Composition: 2,5-FDCA; 2,5-Furandicarboxylic Acid, TPA; Terephthalic acid, EG; Ethylene glycol
P-compound: Irg. 1222 = Irganox 1222 (manufactured by BASF), Compound name; 3,5-Di-tert-butyl-4-hydroxybenzylphosphonic acid diethyl ester TMPA; Trimethyl phosphate

INDUSTRIAL APPLICABILITY

The polyester resin of the present invention is excellent in long-term thermal stability. Thus, it is useful as a constituent member of a solar cell or the like, which is used outdoors, and thus utilization value in industry is high.

The invention claimed is:

1. A polyester resin comprising a product from a reaction between a dicarboxylic acid component and a glycol component in the presence of a catalyst, wherein the dicarboxylic component contains 10 mol % or more of a furandicarboxylic acid, wherein the catalyst is a metal compound and optionally a phosphorus compound, and wherein the polyester resin satisfies following requirements (1) to (3);
   (1) a total metal element content is 150 ppm or less relative to the mass of the polyester resin;
   (2) a phosphorus element content is 100 ppm or less relative to the mass of the polyester resin;
   (3) TOD Δ reduced viscosity represented by the following formula is 0.030 dl/g or less (TOD Δ reduced viscosity)=(Reduced viscosity before thermal oxidation test)−(Reduced viscosity after thermal oxidation test)

wherein the thermal oxidation test is a test in which a polyester resin sample having been subjected to a heat history comprising melting it at a temperature of the melting point of the polyester resin plus 30° C. in the air for 2 minutes and subsequently leaving it at the same temperature under a load of 100 kgf/cm$^2$ for 1 minute is heat treated in the air at a temperature of 180° C. for 60 minutes.

2. The polyester resin according to claim 1, wherein the catalyst is an aluminum compound and a phosphorus compound.

3. The polyester resin according to claim 2, wherein the polyester resin has a melting point of 220° C. or less.

4. The polyester resin according to claim 1, wherein the polyester resin has a melting point of 220° C. or less.

5. A film comprising the polyester resin as described in claim 1.

6. The film according to claim 5, wherein the catalyst is an aluminum compound and a phosphorus compound.

7. The film according to claim 6, wherein the polyester resin has a melting point of 220° C. or less.

8. The film according to claim 5, wherein the polyester resin has a melting point of 220° C. or less.

9. A sheet comprising the polyester resin as defined in claim 1.

10. The sheet according to claim 9, wherein the catalyst is an aluminum compound and a phosphorus compound.

11. The sheet according to claim 10, wherein the polyester resin has a melting point of 220° C. or less.

12. The sheet according to claim 9, wherein the polyester resin has a melting point of 220° C. or less.

13. An injection molded article comprising the polyester resin as defined in claim 1.

14. The injection molded article according to claim 13, wherein the catalyst is an aluminum compound and a phosphorus compound.

15. The injection molded article according to claim 14, wherein the polyester resin has a melting point of 220° C. or less.

16. The injection molded article according to claim 13, wherein the polyester resin has a melting point of 220° C. or less.

* * * * *